United States Patent
Seo

(10) Patent No.: US 6,572,987 B2
(45) Date of Patent: Jun. 3, 2003

(54) LIGHT-EMITTING DEVICE

(75) Inventor: Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/962,498

(22) Filed: Sep. 25, 2001

(65) Prior Publication Data

US 2002/0051896 A1 May 2, 2002

(30) Foreign Application Priority Data

Sep. 28, 2000 (JP) ......................................... 2000-297460

(51) Int. Cl.⁷ ............................................... H05B 33/14
(52) U.S. Cl. ........................ 428/690; 428/917; 313/504; 257/88
(58) Field of Search ................................ 428/690, 917; 313/504; 257/88

(56) References Cited

PUBLICATIONS

Cotton, F.A. et al, "A Triad of Homologous, Air–Stable Compounds Containing Short, Quadruple Bonds Between Metal Atoms of Group 6," Journal of the American Chemical Society, vol. 100, No. 15, pp. 4725–4732, Jul. 19, 1978.

O'Brien, D.F. et al, "Improved Energy Transfer in Electrophosphorescent Devices," Applied Physics Letters, vol. 74, No. 3, pp. 442–444, Jan. 18, 1999.

Tsutsui, T. et al, "High Quantum Efficiency in Organic Light–Emitting Devices with Iridium–Complex as a Triplet Emissive Center," Japanese Journal of Applied Physics, vol. 38, part 2, No. 12B, pp. L 1502–L 1504, Dec. 15, 1999.

Baldo, M.A. et al, "High–Efficiency Fluorescent Organic Light–Emitting Devices Using a Phosphorescent Sensitizer," Nature, vol. 403, pp. 750–753, Feb. 17, 2000.

Full English translation of: "Academy of Applied Physics, Organic Molecules/Division of Bioelectronics/Text of Third Lecture," pp. 31–37, 1993.

*Primary Examiner*—Cynthia H. Kelly
*Assistant Examiner*—Camie Thompson
(74) *Attorney, Agent, or Firm*—Cook, Alex, McFarron, Manzo, Cummings & Mehler, Ltd.

(57) ABSTRACT

A cheaply fabricated light-emitting device which is bright consuming a small amount of electric power, and an electric appliance. An organic EL element capable of converting the triplet excited energy into light is obtained by using, as a light-emitting layer or as a dopant, an organic compound (binuclear complex) having a molecular structure which permits the spin-orbit interaction to easily increase. Here, a cheaply available metal is introduced as a central metal of the binuclear complex to lower the cost of production. Light emitting devices and electric appliances are produced by using the organic EL element.

54 Claims, 9 Drawing Sheets

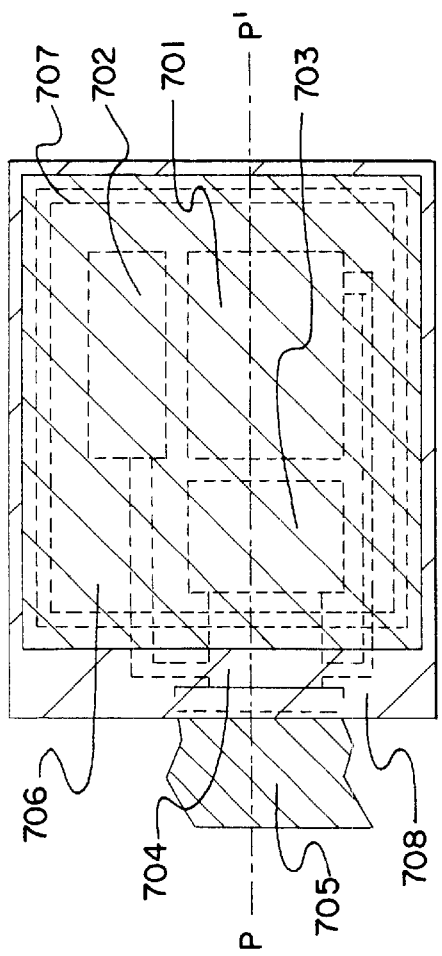
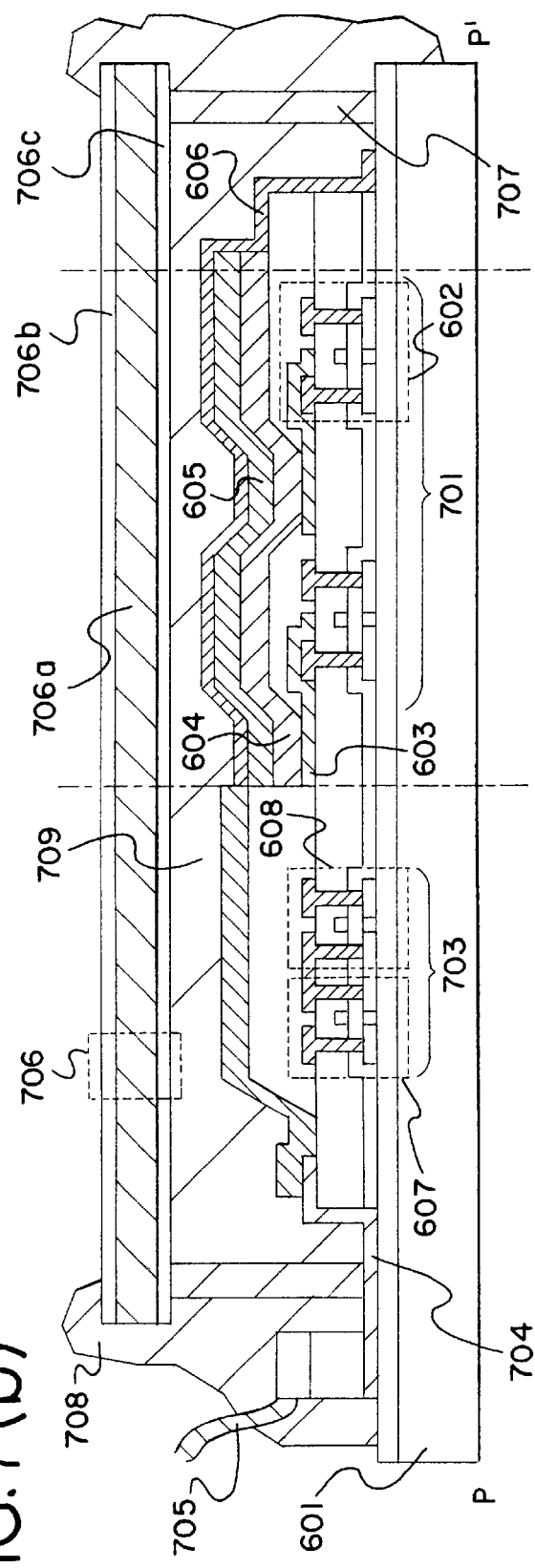
FIG.7(a)
FIG.7(b)

LIGHT-EMITTING DEVICE

BACKGROUND OF THE INVENTION

1. Field of the Invention

This invention relates to a light-emitting device which uses, as a source of light, an element (hereinafter referred to as "organic EL element") comprising a layer (hereinafter referred to as "organic EL film") containing an organic compound capable of obtaining luminescence (electroluminescence, hereinafter referred to as "EL") that takes place upon the application of an electric field, an anode layer and a cathode layer. The EL in the organic compound can be divided into the one that emits light (fluorescent light) when a singlet excited state returns back to a ground state and the one that emits light (phosphorescent light) when a triplet excited state returns back to the ground state. This invention is particularly concerned with a light-emitting device using an organic compound capable of generating phosphorescent light as EL. In this specification, the light-emitting device stands for a picture display device or a light-emitting device using an organic EL element as a light-emitting element. A module in which a TAB (tape automated bonding) tape or a TCP (tape carrier package) is mounted on the organic EL element, a module in which a printed wiring board is provided at an end of the TAB tape or the TCP and a module in which an IC (integrated circuit) is mounted on the organic EL element by the COG (chip on glass) system all pertain to the light-emitting devices.

2. Prior Art

The organic EL element is the one that emits light upon the application of an electric field, and is drawing attention as a flat panel display element of the next generation owing to its properties such as reduced weight, operation on a low DC voltage and high-speed response. Besides, the organic EL element emits light by itself offering a wide visual angle, from which it is expected that the organic EL element can be effectively utilized as a display screen for portable devices.

It is said that the organic EL element has a light emitting mechanism in which the electrons injected through a cathode recombine with the holes injected through an anode to form molecules in an excited state (hereinafter referred to as "molecular exciters"), and energy is released when the molecular exciters return back to the ground state to emit light. The excited state can take the form of a singlet state (S*) and a triplet state (T*), and it has been considered that the statistic ratio of formation is S*:T*=1:3 (literature 1: Tetsuo Tsutsui, "Academy of Applied Physics, Organic Molecules/Division of Bioelectronics/Text of Third Lecture", p. 31, 1993).

When a general organic compound is maintained at room temperature, however, emission of light (phosphorescent light) from the triplet excited state (T*) is not observed. This also holds even for the organic EL element and, usually, the emission of light (fluorescent light) from the singlet excited state (S*) only is observed. Therefore, the theoretical limit of internal quantum efficiency (ratio of photons that are generated to the carriers that are injected) of the organic EL element has been considered to be 25% based on a ground that S*:T*=1:3.

Light that is emitted is not all released to the outside of the light-emitting device, and part of light is not recovered due to the materials (organic EL film, electrodes) constituting the organic EL element and due to refractive index specific to the substrate material. The ratio of the emitted light taken out of the light-emitting device is called light recovery efficiency. When the organic EL element is provided on the glass substrate, it has been said that the recovery efficiency is about 20%.

Because of the above reasons, even if the injected carriers have all formed exciters, it has been said that the theoretical limit of the ratio (hereinafter referred to as "external quantum efficiency") of the photons that can be finally taken out of the light-emitting device to the number of the injected carriers, is 25%×20%=5%. That is, even if the carriers are all recombined, only 5% of them is recovered as light.

In recent years, however, there have been successively announced organic EL elements capable of converting energy (hereinafter referred to as "triplet excited energy") released at the time when the triplet excited state returns back to the ground state into light, and their high light-emitting efficiencies are now drawing attention (literature 2: D. F. O'Brien, M. A. Baldo, M. E. Thompson and S. R. Forrest, "Improved Energy Transfer in Electrophosphorescent Devices", Applied Physics Letters, Vol. 74, No. 3, 442–444, 1999)(literature 3: Tetsuo Tsutsui, Moon-Jae Yang, Masayuki Yahiro, Kenji Nakamura, Teruichi Watanabe, Taishi Tsuji, Yoshinori Fukuda, Takeo Wakimoto and Satoshi Miyaguchi, "High Quantum Efficiency in Organic Light-Emitting Devices with Iridium-Complex as a Triplet Emissive Center", Japanese Journal of Applied Physics, Vol. 38, L1502–L1504, 1999).

The literature 2 uses a metal complex with platinum as a central metal (hereinafter referred to as "platinum complex") and the literature 3 uses a metal complex with iridium as a central metal (hereinafter referred to as "iridium complex"). It can be said that either metal complex has a feature of introducing an element in the third transition system as a central metal. Some of them easily surpass the above-mentioned theoretical limit of 5% of the external quantum efficiency.

By alternatingly laminating a layer of the iridium complex and a layer of DCM2 which is a known fluorescent coloring matter, further, the triplet excited energy formed by the iridium complex can be migrated into the DCM2 contributing to emitting light from the DCM2 (literature 4: M. A. Baldo, M. E. Thompson and S. R. Forrest, "High-Efficiency Fluorescent Organic Light-Emitting Devices using a Phosphorescent Sensitizer", Nature (London), Vol. 403, 750–753, 2000). Emission of light from DCM2 is the emission of light (fluorescent light) from the singlet excited state, and offers an advantage in that the triplet excited energy efficiently generated from the iridium complex can be utilized as the singlet excited energy of DCM2 of other molecules.

As described in literatures 2 to 4, the organic EL element capable of converting the triplet excited energy into light, makes it possible to accomplish an external quantum efficiency higher than convention alone. The luminous intensity increases with an increase in the external quantum efficiency. It is therefore considered that the organic EL element capable of converting the triplet excited energy into light will occupy an increasing weight in the future development as means for accomplishing the emission of light of high brightness and high light emission efficiency.

However, platinum and iridium are both so-called noble metals. Therefore, the platinum complex and the iridium complex using them are expensive and, it is expected that they pose barrier against lowering the cost in the future. In addition, if it is taken into consideration the effect of the metal complex containing heavy metals upon the human body, it is desired to use safer and easily disposable material.

The color of light emitted by the iridium complex is green, i.e., has a wavelength located in the middle of the visible light region. There has not been reported light of any other color emitted by the metal complex using iridium. Further, when the platinum complex is used as a dopant, light that is emitted exhibits red color of a relatively good purity. When the concentration is low, however, the host material, too, shines causing the color purity to be deteriorated. When the concentration is high, however, the light-emitting efficiency decreases due to the concentration quenching.

Namely, highly efficient emission of light of red and blue colors of high purities is not obtained from the organic EL elements capable of converting the triplet excited energy into light. From the standpoint of fabricating a flat panel display of full colors by emitting light of red, green and blue colors, therefore, light of red color and blue color of high purities must be emitted by using a cheap material yet maintaining a high external quantum efficiency like the iridium complex or the platinum complex.

Under the above-mentioned circumstances, it has been urged to develop an organic compound capable of converting the triplet excited energy into light (i.e., capable of emitting phosphorescent light) in addition to the existing iridium complex and the platinum complex.

SUMMARY OF THE INVENTION

It is a subject of the present invention to provide an organic compound capable of converting the triplet excited energy into light cheaply than the conventional compounds. It is further another subject of the invention to provide an organic EL element which features a high light-emitting efficiency and which can be cheaply formed by using the organic compound.

Further, it is a subject of the invention to provide a light-emitting device which is fabricated by using an organic EL element of a high light-emitting efficiency obtained by the invention, which is bright consuming a decreased amount of electric power, and which is cheaply constructed, as well as to provide an electric appliance using the light-emitting device.

The present inventors have given attention to the effect of heavy atoms that has been known in the field of photoluminescence (hereinafter referred to as "PL"). The effect of heavy atoms stands for the effect in which the spin-orbit interaction increases as heavy atoms (holding many atomic nucleus loads) are introduced into the molecules or into the solvent promoting the emission of phosphorescent light. Here, the atomic nucleus load corresponds to the atomic number, i.e., corresponds to the number of positive electric charges of the nucleus.

In order to convert the triplet excited energy into light, therefore, the present inventors have considered that it is most important to introduce the molecular structure having a large spin-orbit interaction. That is, the inventors have considered that the triplet excited energy can be converted into light by introducing the molecular structure having a large spin-orbit interaction even without using heavy atoms, in addition to introducing the action of heavy atoms by using heavy atoms.

As one method, it can be considered to introduce a molecular structure exhibiting ferromagnetic property or diaferromagnetic property. However, neither the metal complexes nor the organic coloring matters used in the conventional organic EL material have a molecular structure that exhibits such a property. It therefore becomes necessary to employ an organic compound having a molecular structure different from that of the material that has heretofore been used for the organic EL elements, so as to exhibit ferromagnetic property or diaferromagnetic property.

The present inventors, therefore, have given attention to a binuclear complex (metal complex having two central metals). The reason is because, the binuclear complex having paramagnetic metal ions often exhibits ferromagnetic or diaferromagnetic interaction in the complex.

In a binuclear complex (hereinafter referred to as "cluster complex") in which the two central metals are metal-to-metal bonded together (hereinafter referred to as "M—M bond"), in particular, the present inventors consider that the total nuclear load further increases and may trigger an effect which is substantially the same as the effect of heavy atoms. This also accounts for why the inventors have given attention to the binuclear complex.

The M—M bond is easily formed under a condition where the d-orbits of the two metal atoms in the metal complex have close energy levels, are expanding sufficiently broadly and have suitable shapes. It is further important that the arrangement of electrons of the orbits is suited for the M—M bond.

Here, as for the expansion of the d-orbit, the element located at a left portion of elements of the transition series is advantageous, and the element positioned on the lower side is more advantageous, for the M—M bond. Therefore, niobium and tantalum (Group V), molybdenum and tungsten (Group VI), and technetium and rhenium (Group VII) easily form the M—M bond in the metal complex. In particular, technetium, rhenium, molybdenum and tungsten exhibit strong bonding forces, often forming a quadruple bond in the metal complex.

Among them, molybdenum and tungsten which are elements of the Group VI are cheaply available metals and are suited for the present invention. Chromium which is an element of the Group VI and is located in the uppermost part of periodic table, has the electron arrangement of the d-orbit like those of molybdenum and tungsten, and is considered to be suited for the M—M bond.

From the foregoing, this invention has a feature in that a cluster complex (hereinafter referred to as "cluster complex of the Group VI") having an element of the Group VI (chromium, molybdenum, tungsten) as a central metal is used for the organic EL element as an organic compound for increasing the spin-orbit interaction.

Here, in particular, tungsten is a heavy atom comparable to iridium or platinum (the atomic number of tungsten is 74 which is nearly comparable to the atomic number 77 of iridium or to the atomic number 78 of platinum), and is highly probable to exhibit the effect of heavy atoms like those of iridium or platinum. Among the above-mentioned cluster complexes of the Group VI, therefore, it is expected that tungsten promote the emission of phosphorescent light relying not only upon the effect of M—M bond but also upon the effect of heavy metals.

As heavy metals comparable to iridium and platinum, further, there can be exemplified transition metals pertaining to the elements of the third transition system. Among them, however, tungsten exists in the greatest amount on earth and is cheaply available, and is suited for this invention.

Therefore, this invention has a feature of using, among the cluster complexes of the Group VI, the metal complex (hereinafter referred to as "tungsten complex") having tungsten as a central metal for the organic EL element as the organic compound in order to increase the spin-orbit interaction.

It is relatively easy to prepare the cluster complex of the Group VI by changing only the central metal in the same ligand. It is considered that the excited energy state changes depending upon the central metal. It is therefore expected to change the color of the emitted light by changing the central metal, creating a large feature of the cluster complex of the Group VI.

BRIEF DESCRIPTION OF THE DRAWINGS

FIGS. 7(a) and 7(b) are diagrams illustrating the structure on the upper surface of the light-emitting device and the sectional structure thereof;

DETAILED DESCRIPTION OF THE INVENTION

Figure 1:
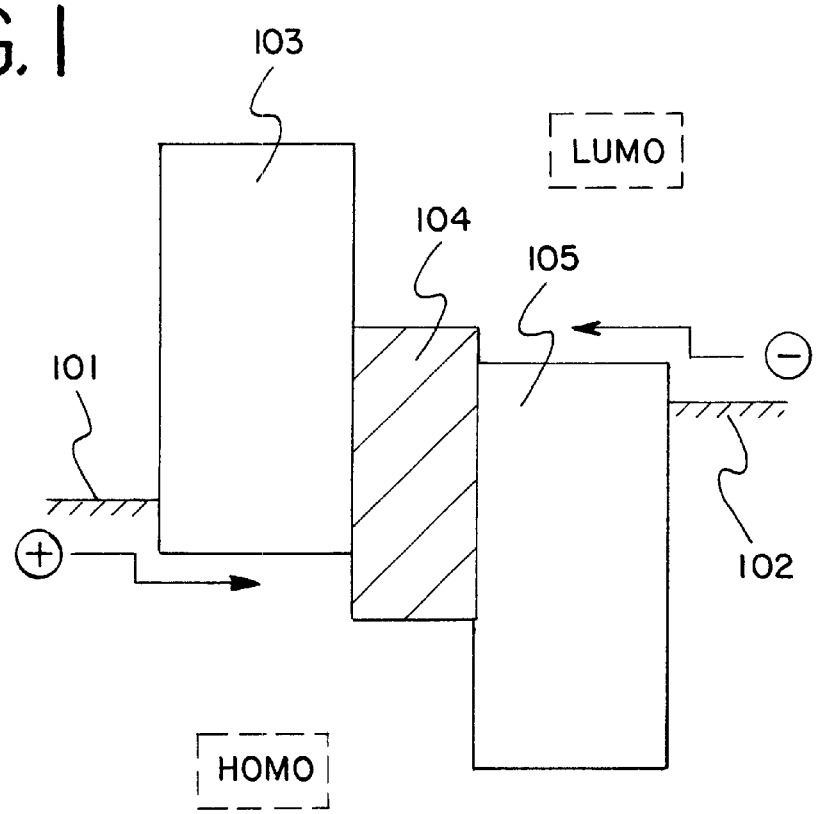
FIG. 1 is a band diagram of an organic EL element.

Organic compounds capable of converting the triple excited energy into light used in this invention can be expressed by the following general formulas (7), (8) and (9):

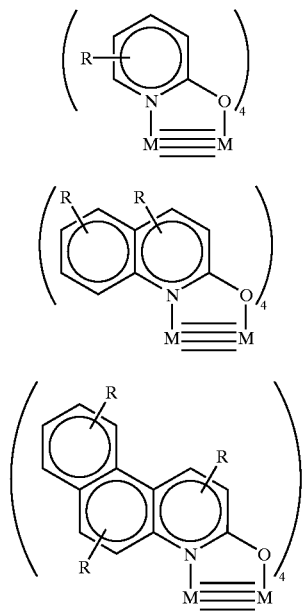

hydrogen atom, a halogen atom, an alkyl group, an alkoxyl group, an aryl group or an aryl group having a substituent.

Among the organic compounds represented by the general formulas (7), (8) and (9), further, the organic compounds in which the central metal M is tungsten are suited for this invention from the standpoint of effect of heavy atoms and are, particularly, desired to be used for this invention.

The above-mentioned organic compounds of the invention are metal complexes using a cheaply available central metal, and can be cheaply obtained compared to the conventional compounds. Besides, the organic EL elements using the above organic compounds convert the triplet excited energy into light making it possible to improve the light-emitting efficiencies to be higher than those of the conventional compounds. Therefore, the light-emitting device using the organic EL element including the organic compound disclosed by this invention is bright, consumes less electric power and is cheaply fabricated.

EXAMPLES

Example 1

This example concretely illustrates the clustered complex of the Group VI represented by the general formula (7).

An organic compound represented by the following formula (10) is a clustered complex of the Group VI using tungsten as a central metal, and from which an increase in the spin-orbit interaction can be expected due to an increase in the total nuclear load based on the M—M bond and due to the effect of heavy tungsten atoms. It is therefore considered that the efficiency is improved for converting the triplet excited energy into light.

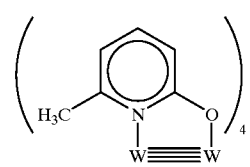

(10)

Example 2

This example concretely illustrates the clustered complex of the Group VI represented by the general formula (8).

An organic compound represented by the following formula (11) is a clustered complex of the Group VI using tungsten as a central metal, and from which an increase in the spin-orbit interaction can be expected due to an increase in the total nuclear load based on the M—M bond and due to the effect of heavy tungsten atoms. It is therefore considered that the efficiency is improved for converting the triplet excited energy into light.

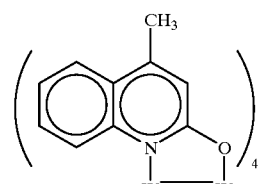

(11)

Example 3

This example concretely illustrates the clustered complex of the Group VI represented by the general formula (9).

An organic compound represented by the following formula (12) is a clustered complex of the Group VI using tungsten as a central metal, and from which an increase in the spin-orbit interaction can be expected due to an increase in the total nuclear load based on the M—M bond and due to the effect of heavy tungsten atoms. It is therefore considered that the efficiency is improved for converting the triplet excited energy into light.

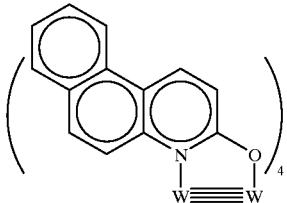

(12)

Example 4

The organic compounds represented by the general formulas (7) to (9) can be used as a light-emitting layer, as a hole transfer layer, as an electron transfer layer or as a dopant in the light-emitting layer in the organic EL element.

When the organic compound of the invention is a metal complex having a lowest unoccupied molecular orbital (LUMO) of a low level and having a highest occupied molecular orbital (HOMO) of a high level, i.e., is a metal complex having a narrow energy gap or is a material which little develops the concentration quenching, the organic compound can be effectively used as the light-emitting layer. FIG. 1 is a band diagram of when the organic compound of the invention is used as a light emitting layer. In FIG. 1, reference numeral 101 denotes an anode, 102 denotes a cathode, 103 denotes a hole transfer layer (HTL), 104 denotes a light-emitting layer (EML), and reference numeral 105 denotes an electron transfer layer (ETL).

Figure 2:
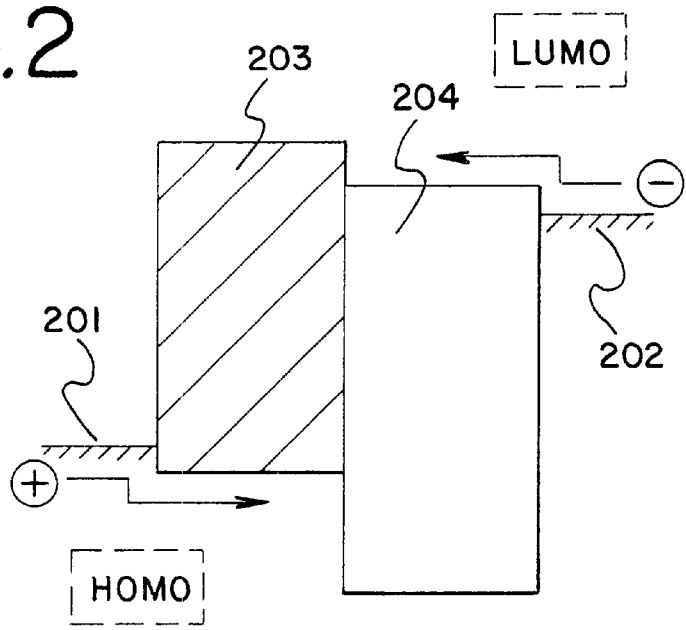
FIG. 2 is a band diagram of an organic EL element.

Further, the organic compound of the invention can be effectively used as a hole-transferring light-emitting layer when it has a hole transfer property. In this case, it is desired to use the electron transfer layer having a low HOMO level as a hole-blocking layer in order to enhance the probability of carrier recombination in the hole transfer layer. FIG. 2 is a band diagram of when the organic compound of the invention is used as a hole transferring light-emitting layer. In FIG. 2, reference numeral 201 denotes an anode, 202 denotes a cathode, 203 denotes a hole-transferring light-emitting layer, and 204 denotes an electron transfer layer.

Figure 3:
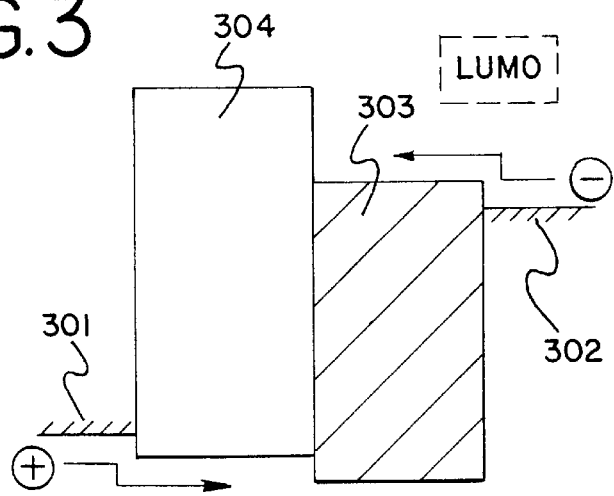
FIG. 3 is a band diagram of an organic EL element.

Further, the organic compound of the invention can be effectively used as an electron-transferring light-emitting layer when it has an electron transfer property. In this case, it is desired to use the hole transfer layer having a high LUMO level as an electron-blocking layer in order to enhance the probability of carrier recombination in the electron transfer layer. FIG. 3 is a band diagram of when the organic compound of the invention is used as an electron-transferring light-emitting layer. In FIG. 3, reference numeral 301 denotes an anode, 302 denotes a cathode, 303 denotes an electron transferring light-emitting layer, and 304 denotes a hole transfer layer.

The organic compound of the invention can be effectively used as a dopant when it is a material having poor carrier transfer property or when it easily develops concentration quenching. Here, however, the condition is that the HOMO level is higher than, and the LUMO level is lower than, those of the host material. The host that is added as a dopant may be either the hole transfer layer or the electron transfer layer, and may, further, be added to the light-emitting layer.

Figure 4:
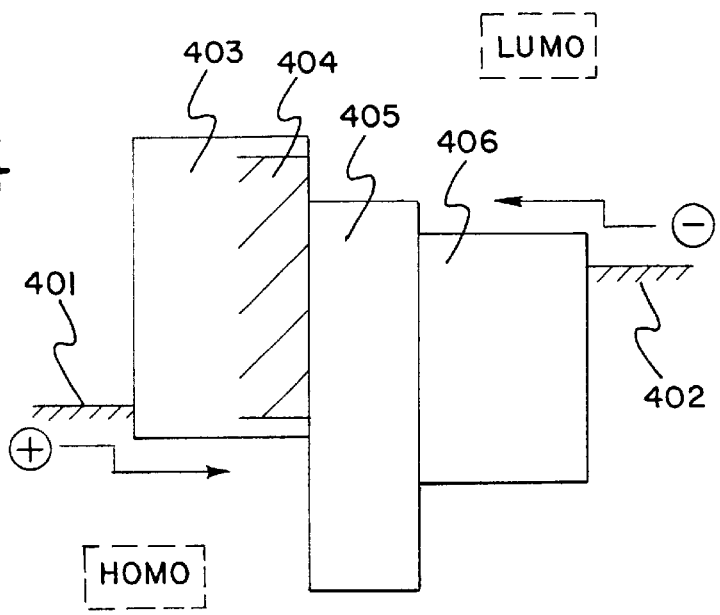
FIG. 4 is a band diagram of an organic EL element.

FIG. 4 is a band diagram of when the organic compound of the invention is added to the hole transfer layer. In FIG. 4, reference numeral 401 denotes an anode, 402 denotes a cathode, 403 denotes a hole transfer layer, 404 denotes a dopant added to the hole transfer layer 403, reference numeral 405 denotes a hole-blocking layer (HBL), and 406 denotes an electron transfer layer.

Example 5

Figure 5:
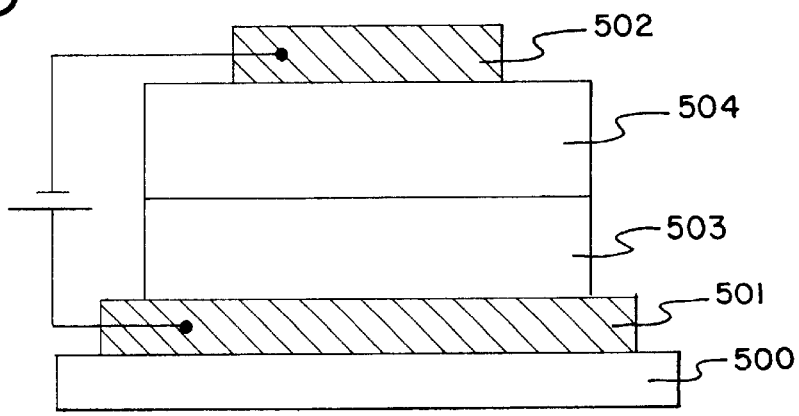
FIG. 5 is a diagram illustrating the structure of an organic EL element.

This example deals with a concrete method of forming an organic EL element by using the organic compound of the invention. FIG. 5 is a diagram illustrating the structure of the element.

First, on a substrate 500 (here, a glass) is formed an indium-tin oxide (ITO) maintaining a thickness of about 100 nm as an anode 501 by sputtering. On the ITO is formed, as a hole-injection layer 503, an aqueous solution which is a mixture of a polyethylenedioxythiophene (PEDOT) represented by the following formula (13).

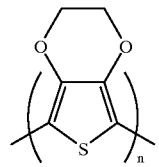

(13)

wherein n is an integer representing a recurring unit, and a polystyrenesulfonic acid (PSS) maintaining a thickness of about 30 nm by spin-coating. After the film is formed, the water is removed by baking.

There is, further, separately prepared a solution by adding an organic compound expressed by the general formula (1) to a toluene solution in which have been mixed a poly(N vinylcarbazole) (hereinafter referred to as "PVK") represented by the following formula (14),

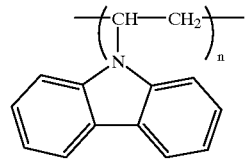

(14)

wherein n is an integer representing a recurring unit, and a 2-biphenylyl-5-(4-tert-butylphenyl)-1,3,4-oxadiazole (hereinafter referred to as "PBD") at a mole ratio of 1:0.3, in a manner that the amount of the organic compound is 3 mol % (the PVK is calculated with the monomer unit as a molecule). This solution is applied by spin-coating onto the positive hole injection layer 503 to form a film of a thickness of 100 nm. Then, toluene is removed by baking to form a light-emitting layer 504.

Finally, an Mg:Ag alloy (Mg:Ag molar ratio of 25:1) is deposited thereon maintaining a thickness of 1000 angstroms and Ag is deposited thereon maintaining a thickness of 500 angstroms to thereby form a cathode 502. The cathode 502 may further be formed by depositing an electrically conducting film containing an alkali metal element or an alkaline earth metal element, or by further depositing an aluminum alloy on the above electrically conducting film.

It is thus made possible to form the organic EL element by dispersing the organic compound of the invention in the high molecular material like in this embodiment.

Example 6

Figure 6:
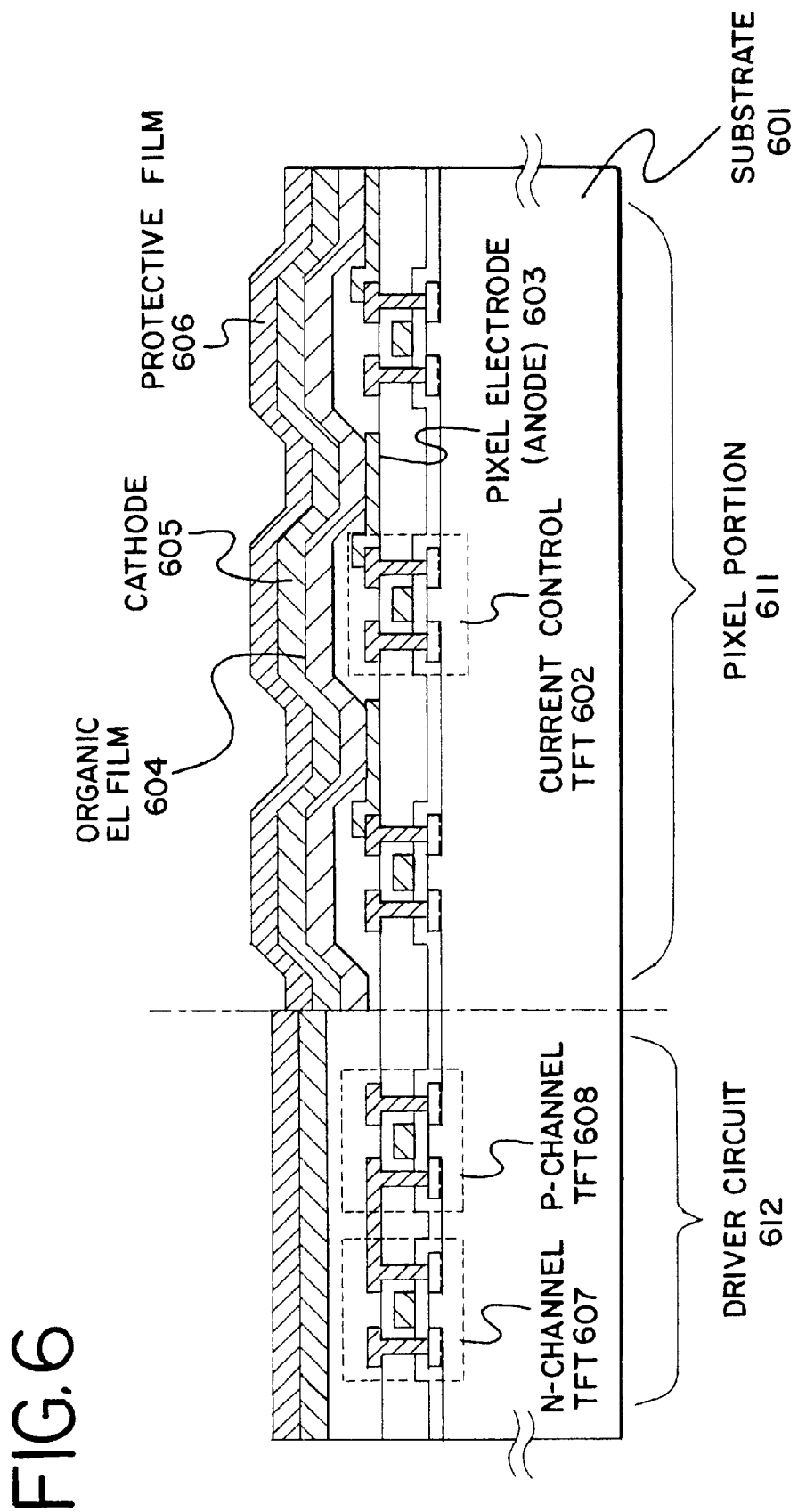
FIG. 6 is a view illustrating the sectional structure of a light-emitting device.

In this Example, a light-emitting device including an organic EL element disclosed in the present invention will be described. FIG. 6 is a sectional view of an active matrix type light-emitting device using an organic EL element of the present invention. Incidentally, although a thin film transistor (hereinafter referred to as a TFT) is used here as an active element, a MOS transistor may be used.

Besides, although a top gate TFT (specifically, a planar TFT) is exemplified as a TFT, a bottom gate TFT (typically, a reverse stagger TFT) can also be used.

In FIG. 6, reference numeral 601 designates a substrate, and the substrate transparent to visible light is used here. Specifically, a glass substrate, a quartz substrate, a crystallized glass substrate, or a plastic substrate (including a plastic film) may be used. Incidentally, the substrate 601 also includes an insulating film provided on the surface of the substrate.

A pixel portion 611 and a driving circuit 612 are provided on the substrate 601. Here, first, the pixel portion 611 will be described.

The pixel portion 611 is a region where an image display is carried out, and includes a plurality of pixels. A TFT (hereinafter referred to as a current control TFT) 602 for controlling a current flowing through an organic EL element, the pixel electrode (anode) 603, the organic EL film 604 and the cathode 605 are provided for each of the pixels. Incidentally, although only the current control TFT is shown in FIG. 6, a TFT (hereinafter referred to as a switching TFT) for controlling a voltage applied to a gate of the current control TFT is provided.

As the current control TFT 602, it is preferable to use a p-channel TFT here. Although an n-channel TFT can also be used, in the case where the current control TFT is connected to an anode of the organic EL element as in the structure of FIG. 6, the p-channel TFT can suppress power consumption more effectively However, as the switching TFT, any of an n-channel TFT and a p-channel TFT may be used.

A pixel electrode 603 is electrically connected to a drain of the current control TFT 602. Here, since a conductive material having a work function of 4.5 to 5.5 eV is used as a material of the pixel electrode 603, the pixel electrode 603 functions as an anode of the organic EL element. As the pixel electrode 603, typically, indium oxide, tin oxide, zinc oxide, or a compound of these may be used.

An EL layer 604 is provided on the pixel electrode 603. The organic EL film 604 is a laminate which is including an organic compound (the general formula 1 to the general formula 6). The form can be taken as a form such as an element structure described in Example 2 to Example 4.

Next, a cathode 605 is provided on the organic EL film 604. A conductive material having a work function of 2.5 to 3.5 eV is used as a material of the cathode 605. As the cathode 605, typically, a conductive film containing an alkaline metal element or an alkaline earth metal element, or a laminate of this conductive film and aluminum alloy may be used.

The layer constituted by the pixel electrode 603, the organic EL film 604, and the cathode 605 is covered with a protection film 606. The protection film 606 is provided to protect the organic EL element against oxygen and water. As a material of the protection film 606, a silicon nitride film, a silicon nitride oxide film, an aluminum oxide film, a tantalum oxide film, or a carbon film (specifically, a diamond-like carbon film) is used. However, these protection films are not always necessary to provide.

Next, the driving circuit 612 will be described. The driving circuit 612 is a region where timings of signals (gate signals and data signals) transmitted to the pixel portion 611 is controlled, and a shift register, a buffer, a latch, an analog switch (transfer gate), or a level shifter is provided. Here, a CMOS circuit formed of an n-channel TFT 607 and a p-channel TFT 608 is shown as a basic unit of these circuits.

Incidentally, the circuit structure of the shift register, buffer, latch, analog switch (transfer gate) or level shifter may be a well-known one. In FIG. 6, although the pixel portion 611 and the driving circuit 612 are provided on the same substrate, it is also possible to electrically connect an IC or LSI without providing the driving circuit 612.

Here, although the anode of the pixel electrode (anode) 603 is electrically connected to the current control TFT 602, a structure can also be adopted in which a cathode of the pixel electrode is electrically connected to the current control TFT. In that case, it is appropriate that the pixel electrode is formed of the same material as the cathode 605, and the cathode is formed of the same material as the pixel electrode (anode) 603. In that case, it is preferable that the current control TFT is made an n-channel TFT.

Here, external appearance views of the active matrix type light-emitting device shown in FIG. 6 are shown in FIGS. 7(a) and 7(b). FIG. 7(a) is a top view and FIG. 7(b) a sectional view taken along P–P' of FIG. 7(a). The symbols of FIG. 6 are used.

In FIG. 7(a), reference numeral 701 designates a pixel portion; 702, a gate signal side driving circuit; and 703, a data signal side driving circuit. Signals transmitted to the gate signal side driving circuit 702 and the data signal side driving circuit 703 are inputted through an input wiring line 704 from a TAB (Tape Automated Bonding) tape 705. Incidentally, although not shown, instead of the TAB tape 705, a TCP (Tape Carrier Package) in which an IC (Integrated Circuit) is provided on a TAB tape may be connected.

At this time, reference numeral 706 designates a cover member provided over the organic EL element shown in FIG. 6, and is bonded through a sealing member 707 made of resin. As the cover member 706, any material may be used as long as oxygen and water does not permeate through it. Here, as shown in FIG. 14(b), the cover member 706 is formed of a plastic member 706a and carbon films (specifically diamond-like carbon films) 706b and 706c provided on the outside surface and the inside surface of the plastic member 706a.

Further, as shown in FIG. 7(b), the seal member 707 is covered with a sealing member 708 made of resin, and the organic EL element is completely sealed in an airtight space 709. At this time, the airtight space 709 may be filled with an inert gas (typically, a nitrogen gas or a rare gas), a resin, or an inert liquid (typically, liquid carbon fluoride typified by perfluoroalkane). Further, it is also effective to provide a moisture absorbent or a deoxidation agent.

Besides, a polarizing plate may be provided on a display surface (surface on which an image is observed) of the light-emitting device shown in this example. This polarizing plate has an effect to suppress reflection of light incident from the outside, and to prevent an observer from being reflected on the display surface. In general, a circular polarization plate is used. However, in order to prevent light emitted from the organic EL element from being returned to the inside through reflection by the polarizing plate, it is desirable to form a structure having low inner reflection by adjusting refractivity.

Example 7

Figure 8A:
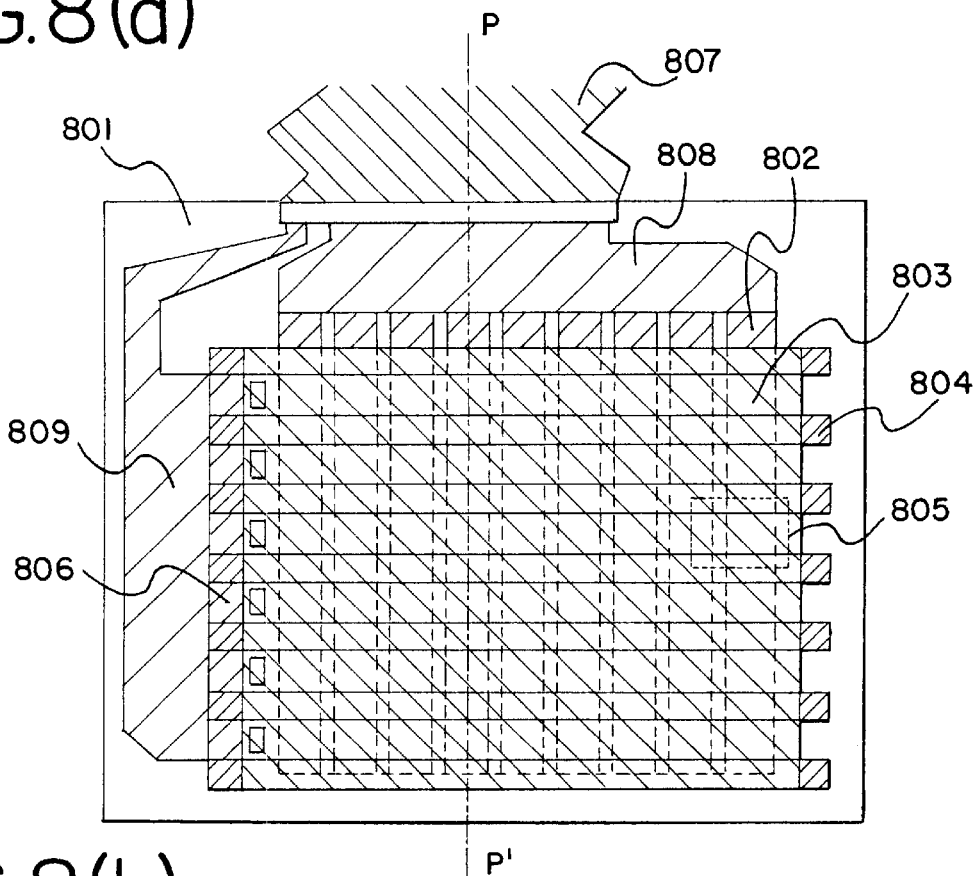
FIGS. 8(a), 8(b) and 8(c) are diagrams illustrating the structure on the upper surface of the light-emitting device and the sectional structure thereof.
Figure 8B:
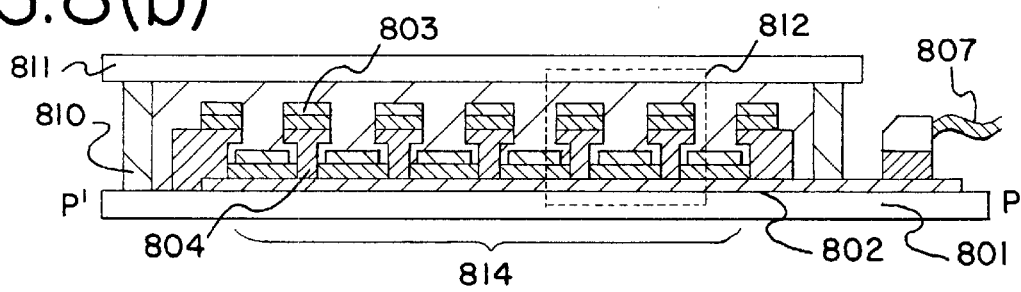

In this example, a passive matrix type light-emitting device will be described as an example of a light-emitting device including an organic EL element disclosed in the present invention. FIG. 8(a) is a top surface view of the passive matrix type light-emitting device and FIG. 8(b) is a cross sectional view of FIG. 8(a) taken along the line P–P'.

In FIG. 8(a), reference numeral 801 designates a substrate, and here, a plastic material is used. As the plastic material, polyimide, polyamide, acryl resin, epoxy resin, PES (polyethylene sulfile), PC (polycarbonate), PET (polyethylene terephthalate), or PEN (polyethylene naphthalate) is shaped into a plate or a film and is used.

Reference numeral 802 designates a scanning line (anode) made of an oxide conductive film, and in this example, an oxide conductive film of zinc oxide, to which gallium oxide is added, is used. Reference numeral 803 designates a data line (cathode) made of a metal film and a bismuth film is used in this example. Reference numeral 804 designates a bank made of acryl resin, and functions as a partition wall for dividing the data line 803. A plurality of scanning lines 802 and data lines 803 are formed to have a stripe shape, and are provided to intersect with each other at right angles. Although not shown in FIG. 8A, an EL layer is interposed between the scanning line 802 and the data line 803, and an intersection portion designated by 805 becomes a pixel.

The scanning line 802 and the data line 803 are connected to an external driving circuit through a TAB tape 807. Reference numeral 808 designates a wiring group in which the scanning lines 802 are collected, and 809 designates a wiring group made of a collection of connection wiring lines 806 connected to the data lines 803. Although not shown, instead of the TAB tape 807, a TCP in which an IC is provided on a TAB tape may be connected.

Besides, in FIG. 8(b), reference numeral 810 designates a seal member; and 811, a cover member bonded to the plastic member 801 by the seal member 810. As the seal member 810, a photo-curing resin may be used, and a material with little degassing and low moisture sorption is desirable. As the cover member, the same material as the substrate 801 is desirable, and glass (including quartz glass) or plastic can be used. Here, a plastic member is used.

Figure 8C:
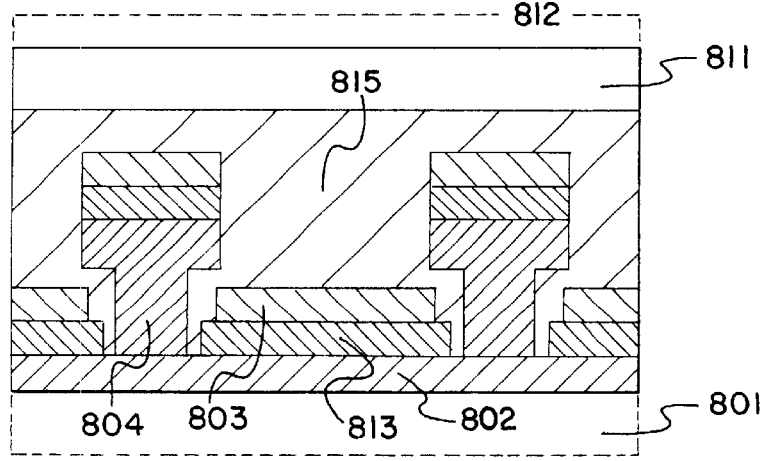

An enlarged view of a structure of the pixel region is shown in FIG. 8(c). Reference numeral 813 designates an organic EL film, which is including an organic compound (the general formula 1 to the general formula 6). The form can be taken as R a form such as an element structure described in Example 2 to Example 4.

Incidentally, as shown in FIG. 8(c), the bank 804 has such a shape that the width of a lower layer is narrower than the width of an upper layer, and physically divides the data line 803. A pixel portion 814 surrounded by the seal member 810 is cut off from the outer air by a sealing member 815 made of resin and has a structure of preventing deterioration of the organic EL film.

Since the pixel portion 814 is formed of the scanning lines 802, the data lines 803, the banks 804, and the organic EL film 813, the light-emitting device of the present invention including the structure as described above can be fabricated by a very simple process.

Besides, a polarizing plate may be provided on a display surface (surface on which an image is observed) of the light-emitting device shown in this example. This polarizing plate suppresses reflection of light incident from the outside, and has an effect of preventing an observer from being reflected on the display surface. In general, a circular polarization plate is used. However, in order to prevent light emitted from the organic EL film from being returned to the inside through reflection by the polarizing plate, it is desirable to make a structure have low inner reflection by adjusting refractivity.

Example 8

In this Example, there is a description of an example in which a printed wiring board is provided with the light-emitting device shown in Example 7 to form a module.

Figure 9A:
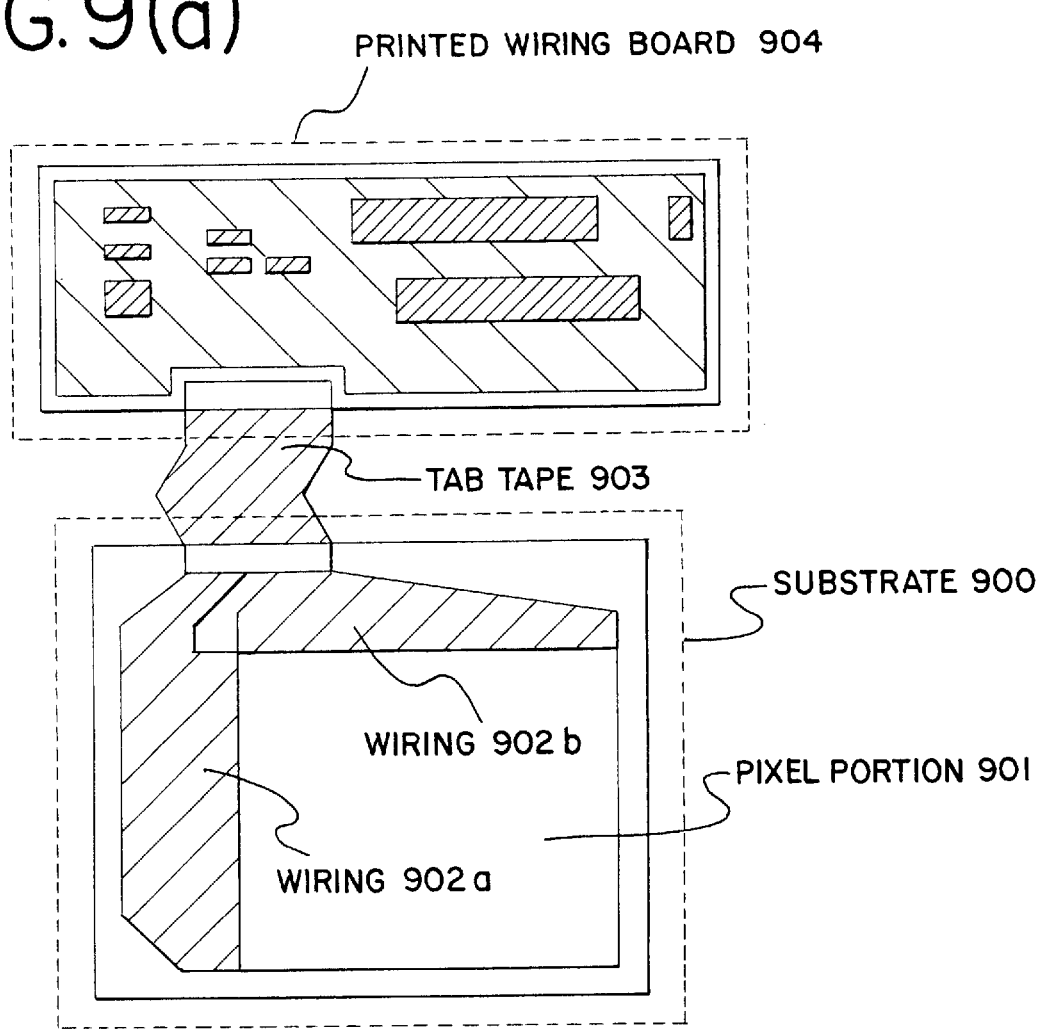
FIGS. 9(a) and 9(b) are diagrams illustrating the constitution of the light-emitting device.

In a module shown in FIG. 9(a), a TAB tape 903 is attached to a substrate 900 (including a pixel portion 911 and wiring lines 902a and 902b) over which an EL element is formed, and a printed wiring board 904 is attached through the TAB tape 903.

Figure 9B:
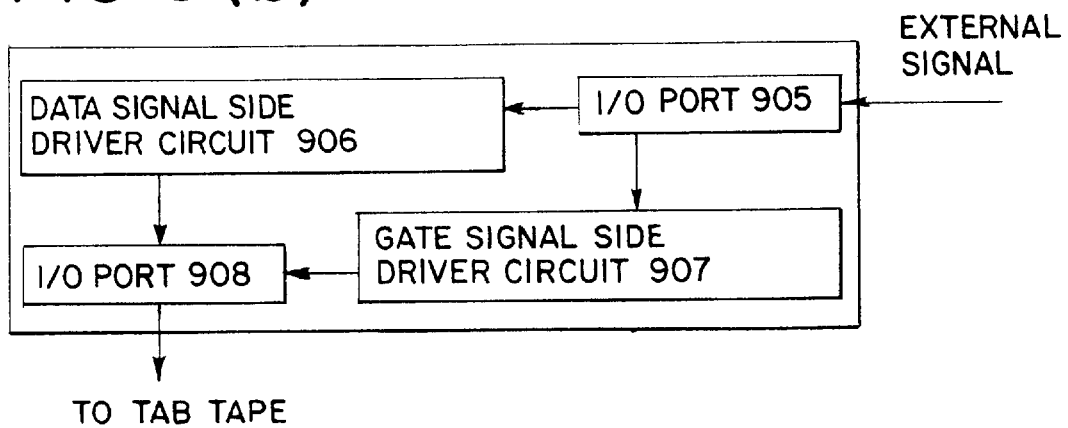

Here, FIG. 9(b) is a functional block diagram of the printed wiring board 904. As shown in FIG. 9(b), at least I/O ports (also called input or output portion) 905 and 908 and an IC functioning as a data signal side driving circuit 906 and a gate signal side driving circuit 907 are provided inside the printed wiring board 904.

The module with the structure, in which the TAB tape is attached to the substrate which has the substrate surface on which the pixel portion is formed and the printed wiring board which has a function as a driving circuit is attached through the TAB tape, is especially called a module with an external driving circuit in the present specification.

Incidentally, as the organic EL element included in the light-emitting device of this example, any of the organic EL element disclosed in the present invention may be used.

Example 9

In this example, a description of an example in which a printed wiring board is provided with the light-emitting device shown in the example 6 or the example 7 to form a module.

Figure 10A:
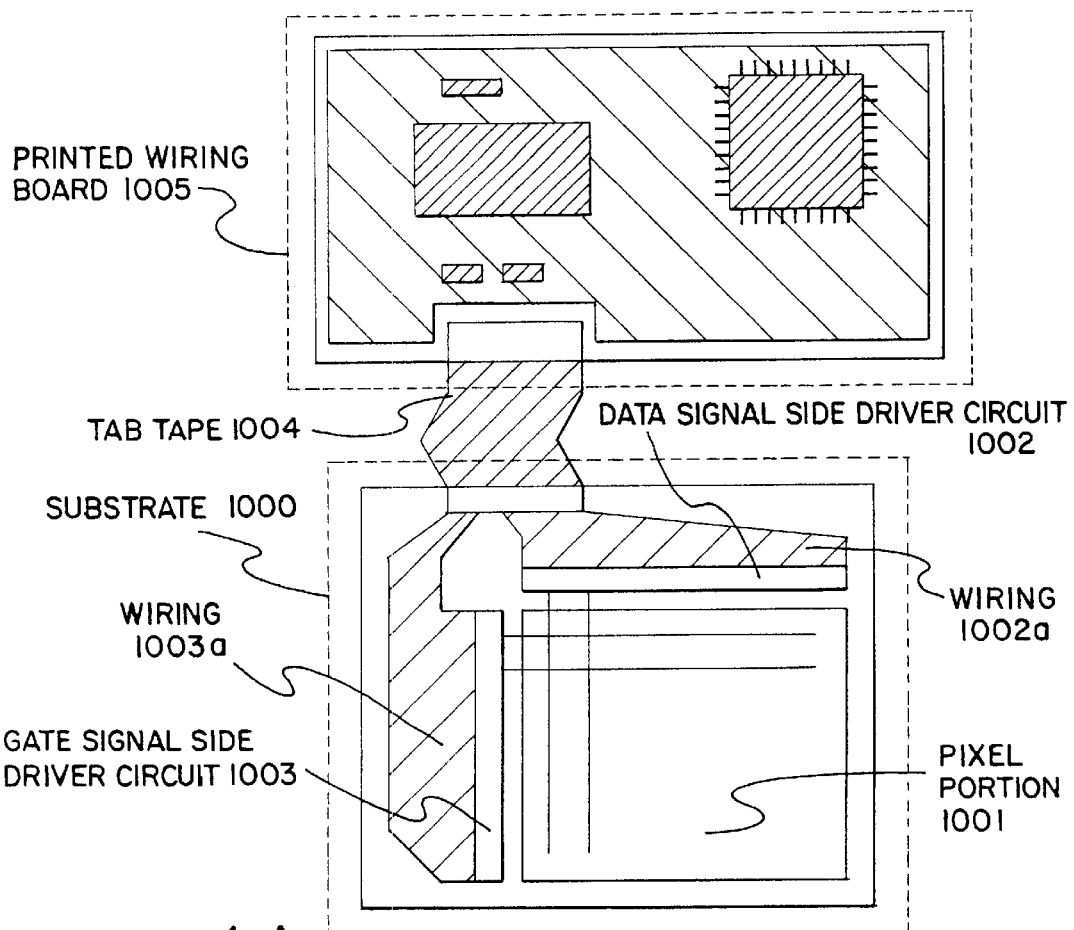
FIGS. 10(a) and 10(b) are diagrams illustrating the constitution of the light-emitting device.

In a module shown in FIG. 10(a), a TAB tape 1004 is attached to a substrate 1000 (including a pixel portion 1001, a data signal side driving circuit 1002, a gate signal side driving circuit 1003, and wiring lines 1002a and 1003a) over which an organic EL element is formed, and a printed wiring plate 1005 is attached through the TAB tape 1004. Here, FIG. 10(b) is a functional block diagram of the printed wiring board 1005.

Figure 10B:
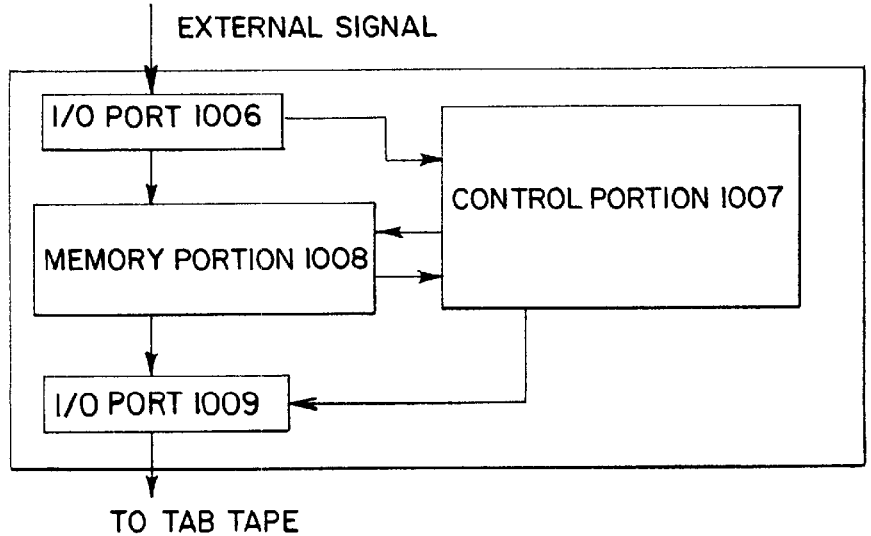

As shown in FIG. 10(b), at least I/O ports 1006 and 1009, and an IC functioning as a control portion 1007 are provided inside the printed wiring board 1005. Incidentally, although a memory portion 1008 is provided here, it is not necessarily required. Besides, the control portion 1007 is a portion, which has a function to control management of a driving circuit, correction of picture data, and the like.

The module of the structure, in which the printed wiring board with the function as a controller is attached to the substrate over which the organic EL element is formed, is especially called a module with an external controller in the present specification.

Incidentally, as the organic EL element included in the light-emitting device of this example, any of the organic EL element disclosed in the present invention may be used.

Example 10

Since the light-emitting device of the present invention is a self-light emitting device, it has advantages that it is excellent visibility and wide angle of visibility in a bright place as compared with liquid crystal devices. Therefore it is effective to use as a display portion for various electronic equipments.

Further, the light-emitting device of the present invention is effective to use for a light source for various electronic equipments, because the light-emitting device has an advantage of bright and low electric power consumption. Typically, the device can be employed as a light source used as a back light or a front light of a liquid crystal display device, or as a light source of illuminating equipment.

In this example, the electronic equipment using a light-emitting device of the present invention to the display portion is described. The specific example is illustrated in FIGS. 11(a) to 11(f) and 12(a) and 12(b). Any structures in FIGS. 1 to 5 can be used as an organic EL element included in the electronic device in the present invention. The form of the light-emitting device included in the electronic equipment of the present invention can be used any forms in FIGS. 6 to 10.

Figure 11A:
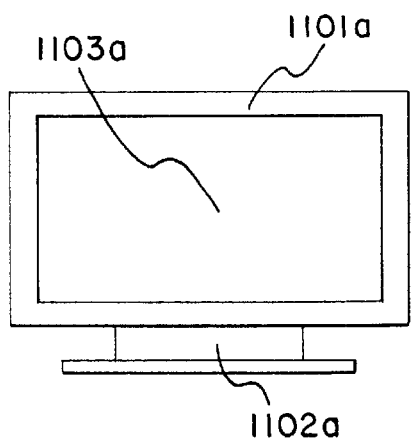
FIGS. 11(a) to 11(f) show examples of electric appliances.

FIG. 11(a) is an organic EL display, and includes a frame 1101a, a support stand 1102a, and a display portion 1103a. The light-emitting device of the present invention can be used in the display portion 1103a. The EL display is a self-light-emitting type, and therefore a back light is not necessary, and the display portion can be made thinner than that of a liquid crystal display device.

Figure 11B:
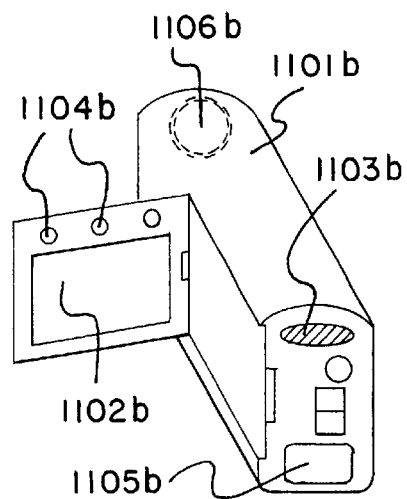

FIG. 11(b) is a video camera, and includes a main body 1110b, a display portion 1102b, a sound input portion 1103b, operation switches 1104b, a battery 1105b, and an image receiving portion 1106b. The light-emitting device of the present invention can be used in the display portion 1102b.

Figure 11C:
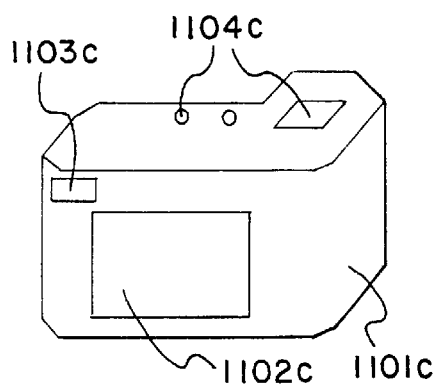

FIG. 11(c) is a digital camera and includes a main body 1101c, a display portion 1102c, an optical system 1103c, an operating switch 1104c. The light-emitting device of the present invention can be used in the display portion 1102c.

Figure 11D:
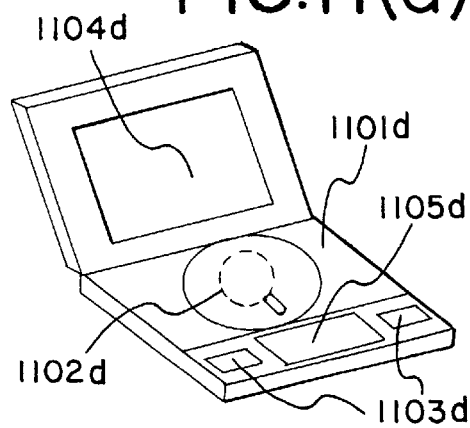

FIG. 11(d) is an image playback device equipped with a recording medium, and includes a main body 1101d, a recording medium (such as a CD, LD or DVD) 1102d, operation switches 1103d, a display portion (a) 1104d, and a display portion (b) 1105d, etc. The display portion (a) 1104d is mainly used for displaying image information, and the display portion (b) 1105d is mainly used for displaying character information, and the light-emitting device of the present invention can be used in the display portion (a) 1104d and for the display portion (b) 1105d. Note that, the image playback device equipped with the recording medium includes devices such as CD playback devices and game machines.

Figure 11E:
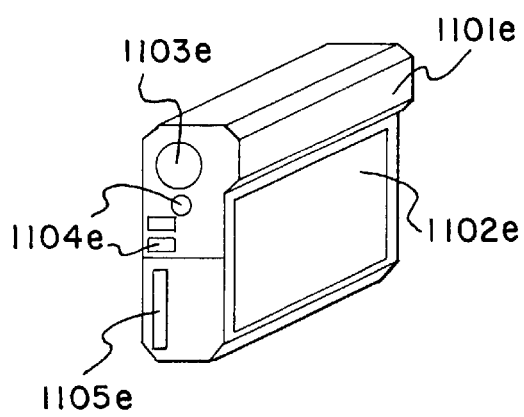

FIG. 11(e) is a portable (mobile) computer, and includes a main body 1101e, a display portion 1102e, an image receiving portion 1103e, operation switches 1104e, and a memory slot 1105e. The electronic optical device of the present invention can be used in the display portion 1102e. This portable computer records information onto the recording medium accumulated with flash memory or non-volatile memory and can play back such recordings.

Figure 11F:
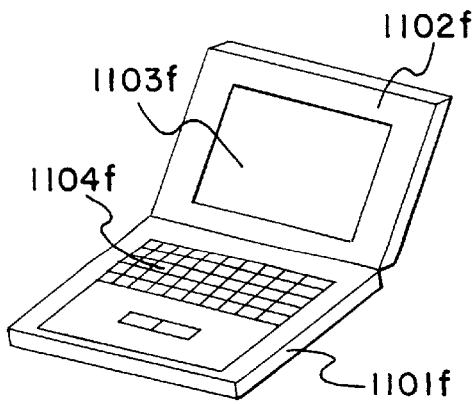

FIG. 11(f) is a personal computer, and includes a main body 1101f, a frame 1102f, a display portion 1103f, and a keyboard 1104f. The light-emitting device of the present invention can be used in the display portion 1103f.

Further, the above electronic appliances often display information distributed through an electronic communication network such as the Internet and radio communication such as a radio wave. In particular, there are more and more opportunities where the electronic appliances display dynamic image information. Since the response speed of an organic EL material is very high, a light-emitting device is suitable for dynamic image display.

Figure 12A:
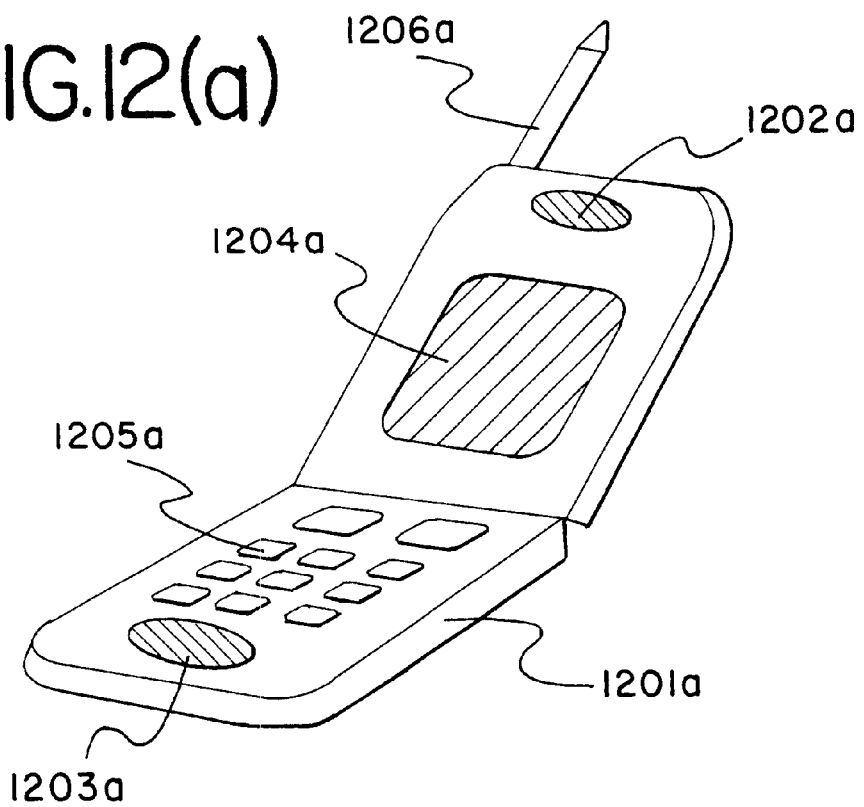
FIGS. 12(a) and 12(b) show examples of electric appliances.

FIG. 12(a) is a cellular phone, and includes a main body 1201a, a sound output portion 1202a, a sound input portion 1203a, a display portion 1204a, operation switches 1205a, and an antenna 1206a. The light-emitting device of the present invention can be used in the display portion 1204a.

Figure 12B:
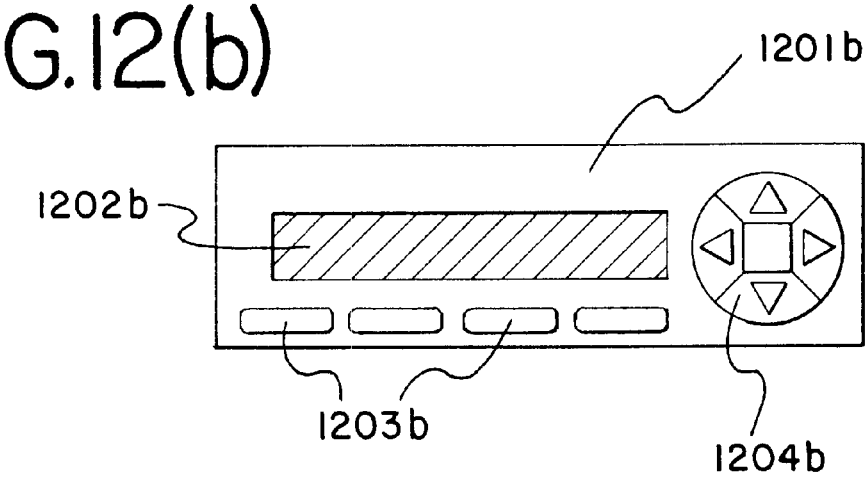

FIG. 12(b) is an audio playback device, (specifically a car audio system), and includes a main body 1201b, a display portion 1202b, and operation switches 1203b and 1204b. The light-emitting device of the present invention can be used in the display portion 1202b. Further, a car audio system is shown in this example, but the light-emitting device of the present invention can be used in a household audio playback system, too.

Further, it is effective to incorporate the light sensor, to provide means to detect the brightness of the environment to be used, in order for it to function to modulate the luminous brightness according to the brightness of the environment to be used. If the user may maintain the brightness with a brightness of a contrast ratio of 100 to 150 compared to the brightness of the used environment, there is no problem in recognizing the image or the character information. That is, when the environment to be used is bright, the brightness of the image is increased so it is easy to see, and when the environment to be used is dark, the brightness of the image may be suppressed to thereby suppress the power consumption.

Even when the display portions of electric appliances shown in FIGS. 11 to 12 of Examples are to be all formed as liquid crystal displays, the light-emitting device of the invention can be used as a back light or a front light for the liquid crystal displays.

The invention provides organic compounds capable of converting the triplet excited energy into light at prices cheaper than the conventional compounds. The invention further provides an organic EL element that features a high light emitting efficiency and that is cheaply fabricated by using the organic compound. The invention further provides a light emitting device which is bright and consumes less electric power by using the organic EL element of a high light-emitting efficiency obtained by the invention, and provides electric appliances using the above light-emitting device. Also, as a method for forming the organic compounds of the present invention, it is possible to use the method as described in 1978 American Chemical Society, Compound with Quadruple Bonds between Metal Atoms, pages 4725–4732, "A Triad of Homologous, Air-Stable Compounds Containing Short, Quadruple Bonds between Metal Atoms of Group 6", by Cotton et al. This is merely one example of how the compounds can be made, but other methods may also be utilized.

What is claimed is:

1. A light-emitting device having an organic EL element, the organic EL element comprising an organic compound represented by the following general formula (1),

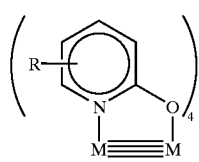

wherein M is an element of the Group VI, and R is selected from the group consisting of a hydrogen atom, a halogen atom, an alkyl group, an alkoxyl group, an aryl group, and an aryl group having a substituent.

2. The light emitting device according to claim 1 wherein said device is an active matrix type.

3. The light emitting device according to claim 1 wherein said device is a passive type.

4. A video camera comprising the light emitting device according to claim 1.

5. A digital camera comprising the light emitting device according to claim 1.

6. An image playback device comprising the light emitting device according to claim 1.

7. A portable computer comprising the light emitting device according to claim 1.

8. A personal computer comprising the light emitting device according to claim 1.

9. A cellular phone comprising the light emitting device according to claim 1.

10. A light-emitting device having an organic EL element, the organic EL element comprising an organic compound represented by the following general formula (2),

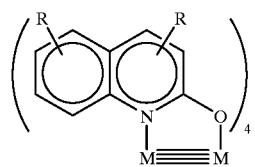

wherein M is an element of the Group VI, and R is selected from the group consisting of a hydrogen atom, a halogen atom, an alkyl group, an alkoxyl group, an aryl group and an aryl group having a substituent.

11. The light emitting device according to claim 10 wherein said device is an active matrix type.

12. The light emitting device according to claim 10 wherein said device is a passive type.

13. A video camera comprising the light emitting device according to claim 10.

14. A digital camera comprising the light emitting device according to claim 10.

15. An image playback device comprising the light emitting device according to claim 10.

16. A portable computer comprising the light emitting device according to claim 10.

17. A personal computer comprising the light emitting device according to claim 10.

18. A cellular phone comprising the light emitting device according to claim 2.

19. A light-emitting device having an organic EL element, the organic EL element comprising an organic compound represented by the following general formula (3),

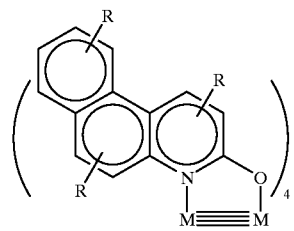

wherein M is an element of the Group VI, and R is selected from the group consisting of a hydrogen atom, a halogen atom; an alkyl group, an alkoxyl group, an aryl group, and an aryl group having a substituent.

20. The light emitting device according to claim 19 wherein said device is an active matrix type.

21. The light emitting device according to claim 19 wherein said device is a passive type.

22. A video camera comprising the light emitting device according to claim 19.

23. A digital camera comprising the light emitting device according to claim 19.

24. An image playback device comprising the light emitting device according to claim 19.

25. A portable computer comprising the light emitting device according to claim 19.

26. A personal computer comprising the light emitting device according to claim 19.

27. A cellular phone comprising the light emitting device according to claim 19.

28. A light-emitting device having an organic EL element, the organic EL element comprising an organic compound represented by the following general formula (4),

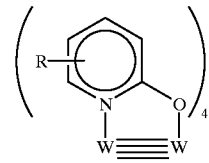

wherein R is selected from the group consisting of a hydrogen atom, a halogen atom, an alkyl group, an alkoxyl group, an aryl group, and an aryl group having a substituent.

29. The light emitting device according to claim 28 wherein said device is an active matrix type.

30. The light emitting device according to claim 28 wherein said device is a passive type.

31. A video camera comprising the light emitting device according to claim 28.

32. A digital camera comprising the light emitting device according to claim 28.

33. An image playback device comprising the light emitting device according to claim 28.

34. A portable computer comprising the light emitting device according to claim 28.

35. A personal computer comprising the light emitting device according to claim 28.

36. A cellular phone comprising the light emitting device according to claim 28.

37. A light-emitting device having an organic EL element, the organic EL element comprising an organic compound represented by the following general formula (5),

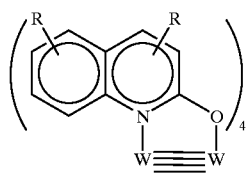

(5)

wherein R is selected from the group consisting of a hydrogen atom, a halogen atom, an alkyl group, an alkoxyl group, an aryl group, and an aryl group having a substituent.

38. The light emitting device according to claim 37 wherein said device is an active matrix type.

39. The light emitting device according to claim 37 wherein said device is a passive type.

40. A video camera comprising the light emitting device according to claim 37.

41. A digital camera comprising the light emitting device according to claim 37.

42. An image playback device comprising the light emitting device according to claim 37.

43. A portable computer comprising the light emitting device according to claim 32.

44. A personal computer comprising the light emitting device according to claim 37.

45. A cellular phone comprising the light emitting device according to claim 37.

46. A light-emitting device having an organic EL element, the organic EL element comprising an organic compound represented by the following general formula (6),

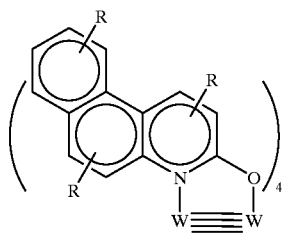

(6)

wherein R is selected from the group consisting of a hydrogen atom, a halogen atom, an alkyl group, an alkoxyl group, an aryl group or an aryl group having a substituent.

47. The light emitting device according to claim 46 wherein said device is an active matrix type.

48. The light emitting device according to claim 46 wherein said device is a passive type.

49. A video camera comprising the light emitting device according to claim 46.

50. A digital camera comprising the light emitting device according to claim 46.

51. An image playback device comprising the light emitting device according to claim 46.

52. A portable computer comprising the light emitting device according to claim 46.

53. A personal computer comprising the light emitting device according to claim 46.

54. A cellular phone comprising the light emitting device according to claim 45.

* * * * *